(12) United States Patent
Danzilio

(10) Patent No.: US 6,703,638 B2
(45) Date of Patent: Mar. 9, 2004

(54) ENHANCEMENT AND DEPLETION-MODE PHEMT DEVICE HAVING TWO INGAP ETCH-STOP LAYERS

(75) Inventor: David Mark Danzilio, Hudson, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/861,037

(22) Filed: May 21, 2001

(65) Prior Publication Data
US 2002/0171076 A1 Nov. 21, 2002

(51) Int. Cl.⁷ .................. H01L 29/06; H01L 31/109
(52) U.S. Cl. .................... 257/12; 257/14; 257/190
(58) Field of Search .................. 257/12, 194, 190, 257/14

(56) References Cited

U.S. PATENT DOCUMENTS

| | | | |
|---|---|---|---|
| 4,742,379 A | 5/1988 | Yamashita et al. | 357/22 |
| 4,792,832 A | 12/1988 | Baba et al. | 357/16 |
| 5,021,857 A * | 6/1991 | Suehiro | 257/194 |
| 5,041,393 A | 8/1991 | Ahrens et al. | 437/58 |
| 5,060,030 A | 10/1991 | Hoke | 357/22 |
| 5,091,759 A | 2/1992 | Shih et al. | 357/22 |
| 5,140,386 A | 8/1992 | Huang et al. | 357/22 |
| 5,262,660 A * | 11/1993 | Streit et al. | 257/14 |
| 5,270,228 A | 12/1993 | Ishikawa | 437/39 |
| 5,272,095 A * | 12/1993 | Motoda | 372/45 |
| 5,330,932 A | 7/1994 | Liu et al. | 437/133 |
| 5,372,675 A | 12/1994 | Wakabayashi et al. | 156/649 |
| 5,504,353 A | 4/1996 | Kuzuhara | 257/194 |
| 5,514,605 A * | 5/1996 | Asai et al. | 438/172 |
| 5,521,404 A | 5/1996 | Kikkawa et al. | 257/194 |
| 5,641,977 A | 6/1997 | Kanamori | 257/192 |
| 5,760,427 A | 6/1998 | Onda | 257/194 |
| 5,811,844 A * | 9/1998 | Kuo et al. | 257/194 |
| 5,854,090 A * | 12/1998 | Iwai et al. | 438/47 |
| 6,258,639 B1 * | 7/2001 | Rohdin et al. | 438/167 |

OTHER PUBLICATIONS

U.S. patent application Ser. No. 09/195,478, Danzilio, filed Nov. 16, 1998.

* cited by examiner

Primary Examiner—Amir Zarabian
Assistant Examiner—Kiesha Rose

(57) ABSTRACT

A depletion/enhancement PHEMT device structure is provided. The structure comprises: (a) a semiconductor substrate; (b) a buffer region comprising one or more semiconductor buffer layers over the substrate; (c) a III-V semiconductor channel layer over the buffer region; (d) an electron donor layer over the channel layer; (e) a GaAs or AlGaAs first schottky layer over the electron donor layer; (f) a first InGaP layer over the first schottky layer; (g) a GaAs or AlGaAs second schottky layer over the first InGaP layer; (h) a second InGaP layer over the second schottky layer; (i) a doped GaAs contact layer over the second InGaP layer; (j) an isolation structure extending from an upper surface of the contact layer at least to the buffer region, the isolation structure defining a first active region and a second active region; (k) an enhancement ohmic source contact and an enhancement ohmic drain contact disposed on the doped GaAs contact layer within the first active region; (l) an enhancement gate recess extending from an upper surface of the contact layer and through the first InGaP layer within the first active region; (m) an enhancement gate contact disposed over the first schottky layer within the enhancement gate recess; (n) a depletion ohmic source contact and a depletion ohmic drain contact disposed on the doped GaAs contact layer within the second active region; (o) a depletion gate recess extending from an upper surface of the contact layer and through the second InGaP layer within the second active region; and (p) a depletion gate contact disposed over the second schottky layer within the depletion gate recess.

16 Claims, 5 Drawing Sheets

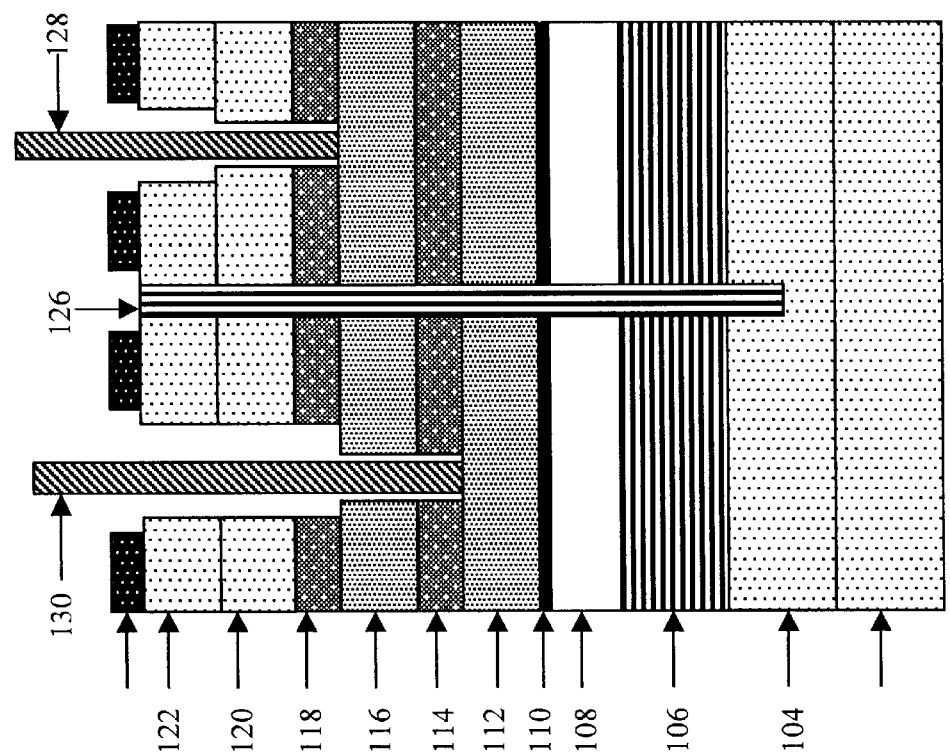
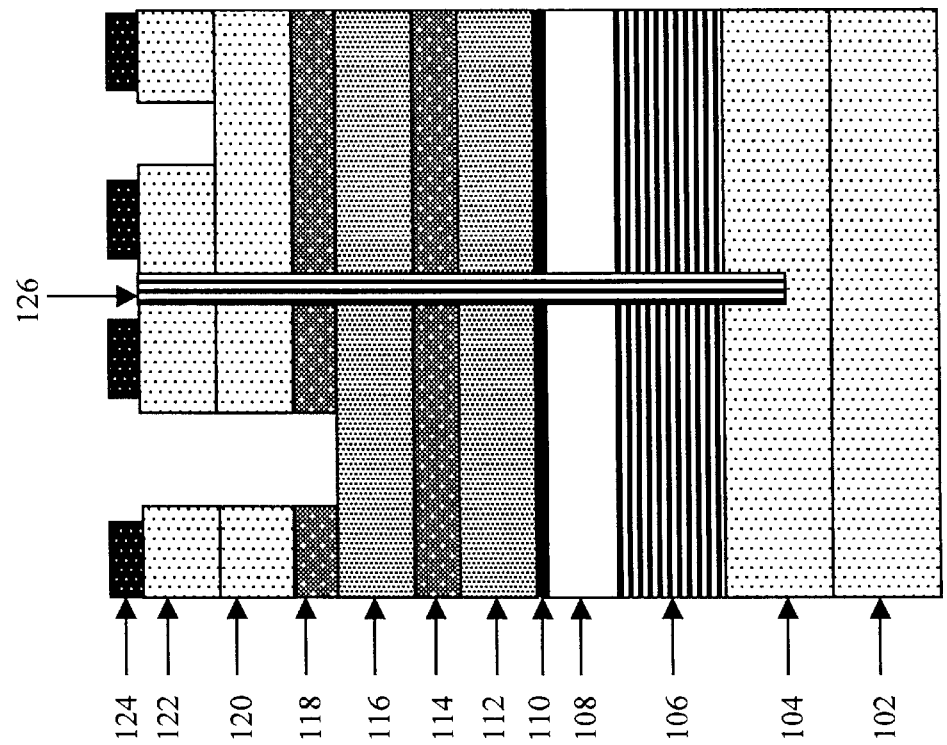
Fig. 3C
Fig. 3B

ENHANCEMENT AND DEPLETION-MODE PHEMT DEVICE HAVING TWO INGAP ETCH-STOP LAYERS

FIELD OF THE INVENTION

The present invention generally relates to integrated circuits comprising both enhancement-mode and depletion-mode pseudomorphic high electron mobility transistor (PHEMT) devices and to methods of manufacturing the same.

BACKGROUND OF THE INVENTION

Several types of field effect transistors (FETs) are available for use at microwave and millimeter wave frequencies. These high frequency FETs include metal semiconductor field effect transistors (MESFETs) and high electron mobility transistors (HEMTs), each of which is typically fabricated from Group III-V materials ("III-V semiconductor"). A HEMT is distinguished from a MESFET in that charge is transferred from a charge donor layer to an undoped channel layer in a HEMT.

There are generally two types of HEMTs. One type is referred to simply as a HEMT, whereas the other type is referred to as a pseudomorphic HEMT or PHEMT. The difference between the HEMT and the PHEMT is that, in the PHEMT, one or more of the layers incorporated into the device has a lattice constant which differs significantly from the lattice constants of other materials of the device. As a result of this lattice mismatch, the crystal structure of the material forming the channel layer is strained. Although this lattice mismatch and the attendant strain makes growth of such devices more difficult than the growth of HEMTs, several performance advantages are obtained. For example, the charge density transferred into the channel layer is increased and high electron mobility and high electron saturated velocity are observed. As a result, the devices can develop higher power levels and can operate at higher frequencies with improved noise properties.

Devices are known, such as direct-coupled FET logic (DCFL) devices, which include both an enhancement-mode field effect transistor and a depletion-mode field effect transistor. These devices are characterized by low power consumption and are suited for constructing high-speed integrated circuits having a large integration density.

An enhancement-type transistor is a transistor that blocks the flow of current when no gate-source voltage is applied (also called a normally-off transistor). A depletion-type transistor is a transistor that allows current to flow when no gate-source voltage is applied (also called a normally-on transistor). Typically, the thickness of the active region upon which the gate contact is formed is different for each of these transistors, with this thickness being smaller for the enhancement-type transistor than it is for the depletion-type transistor.

SUMMARY OF THE INVENTION

The present invention is directed to novel PHEMT devices having both an enhancement-mode and a depletion-mode transistor (also referred to herein as "enhancement/depletion PHEMT devices") and to methods for making the same.

According to a first aspect of the invention, a depletion/enhancement PHEMT device structure is provided. The structure comprises: (a) a semiconductor substrate; (b) a buffer region comprising one or more semiconductor buffer layers over the substrate; (c) a III-V semiconductor channel layer over the buffer region; (d) an electron donor layer over the channel layer; (e) a GaAs or AlGaAs first schottky layer over the electron donor layer; (f) a first InGaP layer over the first schottky layer; (g) a GaAs or AlGaAs second schottky layer over the first InGaP layer; (h) a second InGaP layer over the second schottky layer; (i) a doped GaAs contact layer over the second InGaP layer; (j) an isolation structure extending from an upper surface of the contact layer at least to the buffer region, the isolation structure defining a first active region and a second active region; (k) an enhancement ohmic source contact and an enhancement ohmic drain contact disposed on the doped GaAs contact layer within the first active region; (l) an enhancement gate recess extending from an upper surface of the contact layer and through the first InGaP layer within the first active region; (m) an enhancement gate contact disposed over the first schottky layer within the enhancement gate recess; (n) a depletion ohmic source contact and a depletion ohmic drain contact disposed on the doped GaAs contact layer within the second active region; (o) a depletion gate recess extending from an upper surface of the contact layer and through the second InGaP layer within the second active region; and (p) a depletion gate contact disposed over the second schottky layer within the depletion gate recess.

Preferably, the semiconductor substrate is a GaAs substrate, the III-V semiconductor channel layer is an InGaAs channel layer, and the electron donor layer is a plane of silicon atoms.

The buffer region is preferably one comprising one or more III-V semiconductor layers, more preferably one comprising a GaAs buffer layer and a superlattice buffer comprising alternating layers of GaAs and AlGaAs.

The first schottky layer is preferably from 50 to 150 Angstroms in thickness, is preferably an $Al_xGa_{1-x}As$ layer, in which x ranges from 0.35 to 0.75, and is preferably undoped. The second schottky layer is preferably from 50 to 150 Angstroms in thickness, is preferably an $Al_xGa_{1-x}As$ layer in which x ranges from 0.15 to 0.25, and is preferably doped.

The first and second InGaP layers are preferably $In_zGa_{1-z}P$ layers in which z ranges from 0.4 to 0.6, and they preferably range from 10 to 50 Angstroms in thickness.

The isolation structure is preferably an ion implanted structure.

In some preferred embodiments, the depletion/enhancement PHEMT device structure further comprises (a) a doped GaAs or AlGaAs transition layer between the second InGaP layer and the doped GaAs contact layer, in which the transition layer has a lower net doping concentration than the contact layer, (b) an undoped GaAs cap layer between the first schottky layer and the first InGaP layer, in which the cap layer ranges from 15 to 50 Angstroms in thickness, and/or (c) an AlGaAs spacer layer between the channel layer and the electron donor layer.

In some embodiments, the depletion gate recess is greater in aperture within its upper portions than it is within its lower portions, and the enhancement gate recess is greater in aperture within its upper portions than within its lower portions. More preferably, the depletion gate recess is greater in aperture within the doped GaAs contact layer than it is within the second InGaP layer, while the enhancement recess is greater in aperture within the doped GaAs contact layer and the second InGaP layer than it is within the second schottky layer and the first InGaP layer.

According to a second aspect of the invention, a method of forming a depletion/enhancement PHEMT device structure is provided. The method comprises:

(1) providing a multi-layer structure comprising: (a) a semiconductor substrate; (b) a buffer region over the substrate, the buffer region comprising one or more semiconductor buffer layers; (c) a III-V semiconductor channel layer over the buffer region; (d) an electron donor layer over the channel layer; (f) a GaAs or AlGaAs first schottky layer over the electron donor layer; (g) a first InGaP layer over the first schottky layer; (h) a GaAs or AlGaAs second schottky layer over the first InGaP layer; (i) a second InGaP layer over the second schottky layer; (j) a doped GaAs contact layer over the second InGaP layer; (k) ohmic contacts disposed on the doped GaAs contact layer; and (l) an isolation structure extending from an upper surface of the contact layer at least to the buffer region, with the isolation structure defining a first active region and a second active region;

(2) etching, within the first active region, an enhancement gate recess that extends from an upper surface of the contact layer down through the first InGaP layer;

(3) depositing an enhancement gate contact over the first schottky layer within the enhancement gate recess;

(4) etching, within the second active region, a depletion gate recess that extends from an upper surface of the contact layer down through the second InGaP layer; and (5) depositing a depletion gate contact over the second schottky layer within the depletion gate recess.

The enhancement gate recess and the depletion gate recess are preferably etched using wet etching processes.

In a first preferred group of embodiments, the enhancement gate recess is etched by a process that includes the following steps: (a) etching a first active area recess from an upper surface of the contact layer to an upper surface of the second InGaP layer in a first enhancement recess etching step; (b) further etching the first active area recess through the second InGaP layer in a second enhancement recess etching step; (c) further etching the first active area recess to an upper surface of the first InGaP layer in a third enhancement recess etching step; and (d) further etching the first active area recess through the first InGaP layer in a fourth enhancement recess etching step to complete the enhancement gate recess. Also within this group of embodiments, the depletion gate recess is etched by a process that preferably includes the following steps: (a) etching a second active area recess from an upper surface of the contact layer to an upper surface of the second InGaP layer in a first depletion recess etching step; and (b) further etching the second active area recess through the second InGaP layer in a second depletion recess etching step to complete the depletion gate recess.

Within this first preferred group of embodiments, the first enhancement recess etching step, the third enhancement recess etching step and the first depletion recess etching step are preferably conducted using an aqueous etching solution comprising $H_2SO_4$ and $H_2O_2$, while the second enhancement recess etching step, the fourth enhancement recess etching step, and the second depletion etching step are preferably conducted using an aqueous etching solution comprising HCl.

Also within this first preferred group of embodiments, the first and second enhancement recess etching steps are preferably conducted such that an upper first active area recess having a first aperture is formed within the doped GaAs contact layer and within the second InGaP layer; and the third and fourth enhancement etching steps are preferably conducted such that a lower first active area recess having a second aperture narrower than the first aperture is formed within the second schottky layer and within the first InGaP layer.

Further within this first preferred group of embodiments, the third enhancement recess etching step is preferably performed concurrently with the first depletion recess etching step, the fourth enhancement recess etching step is preferably performed concurrently with the second depletion recess etching step, and the enhancement gate contact is preferably deposited concurrently with the depletion gate contact. The steps can also be performed independently.

In a second preferred group of embodiments, the multi-layer structure further comprises a doped GaAs or AlGaAs transition layer between the second InGaP layer and the doped GaAs contact layer, with the transition layer having a lower net doping concentration than the contact layer. Moreover, the enhancement gate recess is etched within this group of embodiments by a process comprising the following: (a) etching a first active area recess from an upper surface of the contact layer to an upper surface of the second InGaP layer in a first enhancement recess etching step; (b) further etching the first active area recess through the second InGaP layer in a second enhancement recess etching step; (c) further etching the first active area recess to an upper surface of the first InGaP layer in a third enhancement recess etching step; and (d) further etching the first active area recess through the first InGaP layer in a fourth enhancement recess etching step to complete the enhancement gate recess. Furthermore, the depletion gate recess is etched within this group of embodiments by a process comprising the following: (a) etching a second active area recess from an upper surface of the contact layer to an upper surface of the transition layer in a first depletion recess etching step; (b) further etching the second active area recess to an upper surface of the second InGaP layer in a second depletion recess etching step; and (c) further etching the second active area recess through the second InGaP layer in a third depletion recess etching step to complete the depletion gate recess.

Within this second preferred group of embodiments, (a) the first and second enhancement recess etching steps are preferably conducted such that an upper first active area recess having a first aperture is formed within the doped GaAs contact layer, within the transition layer, and within the second InGaP layer, (b) the third and fourth enhancement recess etching steps are preferably conducted such that a lower first active area recess having a second aperture narrower than the first aperture is formed within the second schottky layer and within the first InGaP layer, (c) the first depletion recess etching step is preferably conducted such that an upper second active area recess having a third aperture is formed within the doped GaAs contact layer, and (d) the second and third depletion recess etching steps are preferably conducted such that a lower second active area recess having a fourth aperture that is narrower than the third aperture is formed within the transition layer and within the second InGaP layer.

Also within this second preferred group of embodiments, the third enhancement recess etching step is preferably performed concurrently with the second depletion recess etching step, the fourth enhancement recess etching step is preferably performed concurrently with the third depletion recess etching step, and the enhancement gate contact is preferably deposited concurrently with the depletion gate contact.

Further within this second preferred group of embodiments, each of the first enhancement step, the third enhancement recess etching step and the second depletion recess etching step is preferably conducted using an aqueous etching solution comprising $H_2SO_4$ and $H_2O_2$, and each of the second enhancement recess etching step, the fourth enhancement recess etching step, and the third depletion step is preferably conducted using an aqueous etching solution comprising HCl.

One advantage of the present invention is that a PHEMT device containing both enhancement-mode and depletion-mode transistors can be achieved (1) with good control of the thickness of the active region adjacent the gate metal and (2) without using etch-stop materials that increase transistor source resistance.

Due to the etch stop materials used, another advantage of the present invention is that a PHEMT device containing both enhancement-mode and depletion-mode transistors can be achieved using wet etching techniques that: (1) involve conventional and easily controlled etching chemistry, (2) provide high selectivity, and (3) enable large volume batch mode etch operations, reducing considerably the capital equipment, labor content and cycle time associated with the device.

Another advantage of the present invention is that a PHEMT device containing both enhancement-mode and depletion-mode transistors can be achieved using relatively few process steps.

Yet another advantage of the present invention is that a PHEMT device containing both enhancement-mode and depletion-mode transistors can be achieved without resorting to techniques, such as reactive ion etching techniques, that prevent implementation of highly efficient batch-mode processing and can result in crystal damage and degrade transistor performance.

These and other embodiments and advantages of the present invention will be better understood by those of ordinary skill in the art upon review of the Detailed Description and claims to follow.

BRIEF DESCRIPTION OF THE DRAWINGS

FIGS. 3A–3C are schematic cross-sectional views sequentially illustrating the formation of manufacturing a PHEMT device containing both enhancement-mode and depletion-mode transistors, according to yet another embodiment of the invention.

DETAILED DESCRIPTION

The present invention now will be described more fully hereinafter with reference to the accompanying drawings, in which preferred embodiments of the invention are shown. This invention may, however, be embodied in different forms and should not be construed as being limited to the embodiments set forth herein.

A first PHEMT device containing both enhancement-mode and depletion-mode transistors and a method of making the same will now be described in connection with FIGS. 1A–1E, according to an embodiment of the invention.

Figure 1B:
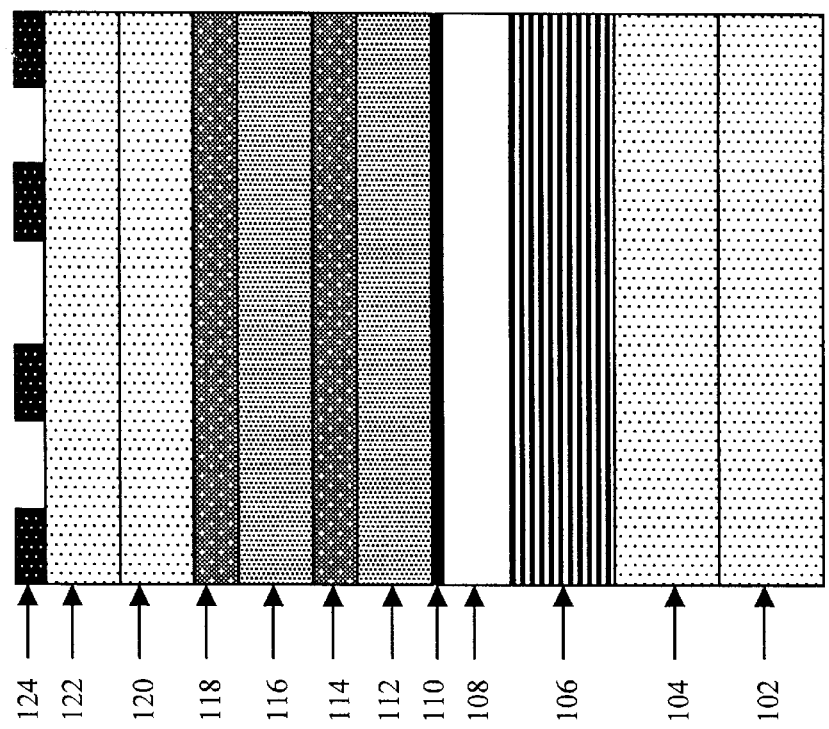
FIGS. 1A–1E are schematic cross-sectional views sequentially illustrating the formation of a PHEMT device containing both enhancement-mode and depletion-mode transistors, according to an embodiment of the invention.
Figure 1A:
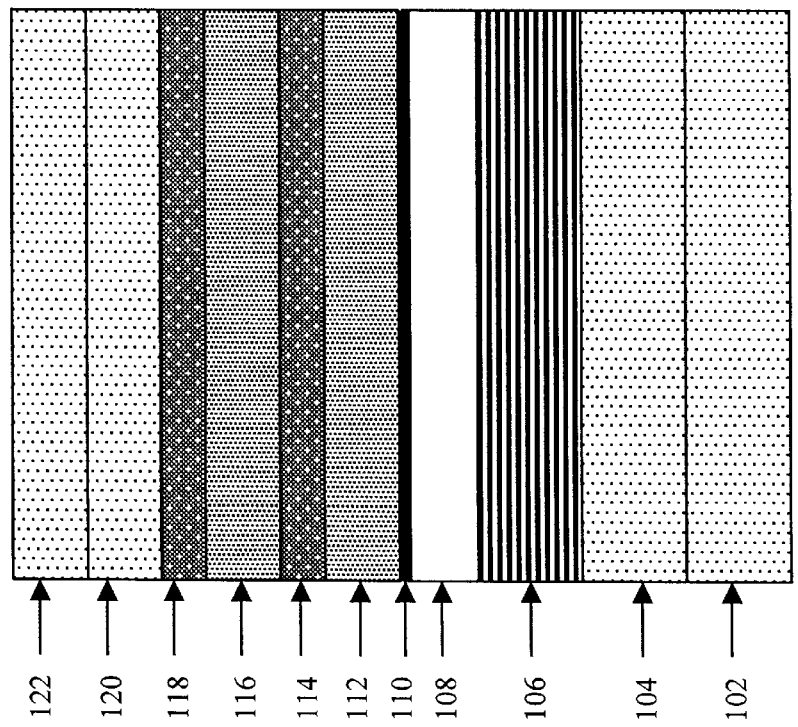
Figure 1D:
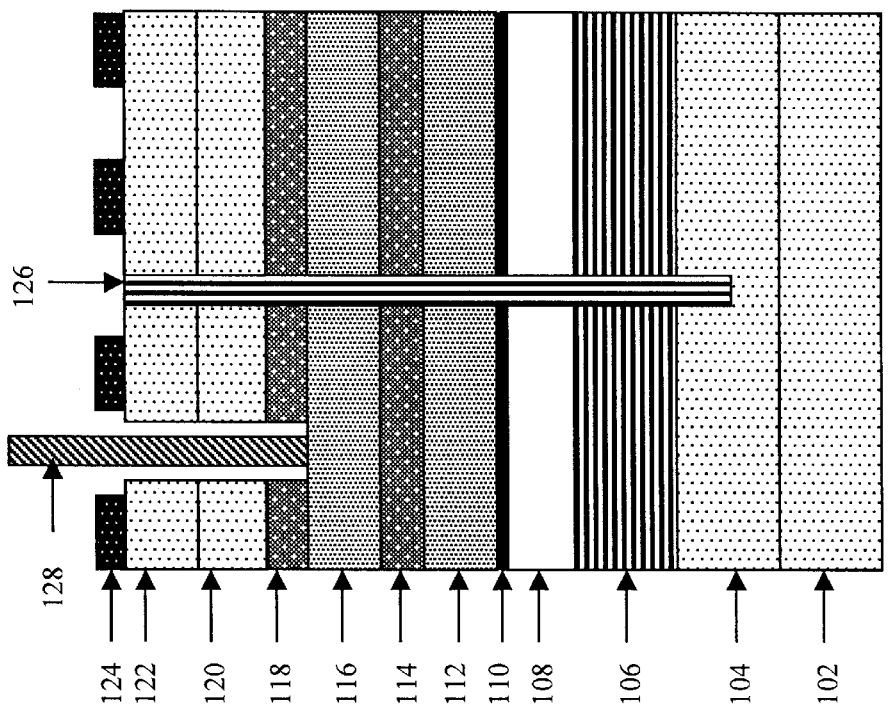

FIG. 1A illustrates a multi-layer structure, the bottom layer of which is a semiconductor substrate 102. The semiconductor substrate 102 is preferably a III-V semiconductor substrate and more preferably an undoped GaAs substrate.

On the semiconductor substrate 102 is disposed a buffer region, which includes one or more semiconductor buffer layers. The specific buffer region used in this embodiment includes a buffer layer 104 of undoped GaAs (which can be, e.g., 1000 to 10000 Å thick) as well as a superlattice buffer 106, which is preferably composed of alternating layers of GaAs (which can be, for example, 15–50 Å thick) and $Al_xGa_{1-x}As$ (which can be, for example, 15 to 300 Å thick), where x typically ranges from 0.1 to 0.4. The superlattice buffer 106 generally contains 5 to 30 periods (10 to 60 alternating layers) and preferably terminates with a layer of $Al_xGa_{1-x}As$.

The above layers corresponding to buffer layer 104 and superlattice buffer 106, as well as the layers discussed below, are preferably grown over the substrate by techniques commonly used in the art, such as molecular beam epitaxy (MBE) and/or metal-organic chemical vapor deposition (MOCVD).

Upon the top layer of the superlattice buffer 106 is disposed a III-V semiconductor channel layer 108, which is preferably an InGaAs layer, and more preferably an undoped $In_yGa_{1-y}As$ channel layer, where y preferably ranges from of 0.1 to 0.3 and where the thickness ranges from 60 to 180 Å.

In certain preferred embodiments, a spacer layer (not shown) is provided on the channel layer 108. The spacer layer can be, for example, a layer of undoped AlGaAs, more preferably a 20 to 60 Å layer of $Al_xGa_{1-x}As$, where x ranges from 0.15 to 0.25.

A charge donor layer 110, more preferably an electron donor layer, is then provided. Any appropriate charge donor layer 110 known in the art for this purpose can be used. In the specific example of FIG. 1A, this layer is a plane of silicon atoms.

A GaAs or AlGaAs first schottky layer 112, which can be doped or undoped, is then deposited. More preferably, the first schottky layer is an undoped $Al_xGa_{1-x}As$ schottky layer of 50 to 150 Å in thickness, where x preferably ranges from 0.35 to 0.75.

In certain preferred embodiments, a thin cap layer (not shown) is provided upon the first schottky layer 112 for oxidation protection. For example, the cap layer can be a thin (e.g., 15 to 50 Å) undoped GaAs cap layer.

A first InGaP etch-stop layer 114 is then deposited on the structure. Preferably, the etch-stop layer 114 is an $In_zGa_{1-z}P$ layer, where z preferably ranges from 0.4 to 0.6 and where the layer thickness preferably ranges from 10 to 50 Å.

A GaAs or AlGaAs second schottky layer 116 is then provided, which can be doped or undoped. Preferably, the second schottky layer 116 is an n-doped $Al_xGa_{1-x}As$ layer of 50 to 150 Å in thickness, where x preferably ranges from 0.15 to 0.25, and where the net doping concentration preferably ranges from $10^{16}$ to $10^{18}$ cm$^{-3}$.

A second InGaP etch-stop layer 118 is deposited over the second schottky layer 116. Like the first etch-stop layer 114, the second etch-stop layer 118 is preferably an $In_zGa_{1-z}P$ layer, where z ranges from 0.4 to 0.6 and where the layer thickness preferably ranges from 10 to 50 Å.

The top layer in FIG. 1A is a doped GaAs contact layer 122. Preferably, the doped GaAs contact layer 122 is an n+doped GaAs contact layer having a preferred thickness of 200–1000 Å and a preferred net doping concentration of $10^{18}$ to $10^{19}$ cm$^{-3}$.

In certain embodiments, including the embodiment shown, a transition layer 120 is provided between the second InGaP etch-stop layer 118 and the n+ doped GaAs contact layer 122. The transition layer 120 is preferably an n-GaAs transition layer having a thickness of 200–500 Å and a net doping concentration of $1\times10^{17}$ to $1\times10^{18}$ cm$^{-3}$.

The resulting multi-layer structure is illustrated in FIG. 1A.

Subsequently, ohmic contacts 124 (four contacts are shown, one of which is labeled) are formed on contact layer 122, preferably using photolithographic and metal deposition techniques commonly used in the manufacture of GaAs monolithic microwave integrated circuits (MMICs). The resulting structure is shown in FIG. 1B. The four ohmic contacts 124 illustrated are ultimately used as the source and drain contacts for the enhancement and depletion PHEMTs. Preferred metal deposition techniques are evaporation techniques. AuGe is a preferred material for the ohmic contacts 124.

Figure 1C:
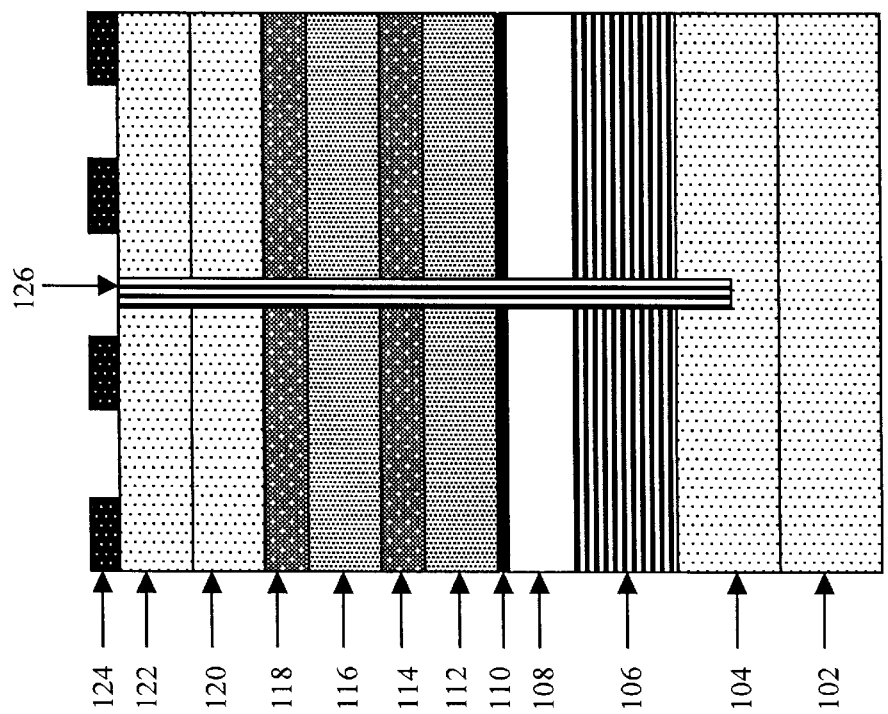

Referring now to FIG. 1C, an isolation structure 126 is formed. The isolation structure 126 preferably extends from an upper surface of the multi-layer structure to the buffer region, and more preferably to the buffer layer 104. The isolation structure 126 can be formed, for example, using a photolithographic process to define the desired areas followed by ion implantation as is well known in the art. This step defines two active regions: one to the left of the isolation structure 126 (which, in this set of Figures, corresponds ultimately to the depletion mode PHEMT) and one to the right of the isolation structure 126 (which corresponds to the enhancement mode PHEMT).

An appropriate photolithographic process is then preferably employed to define a photoresist pattern, which includes an opening corresponding to the gate of the depletion-mode PHEMT. This photolithographic process is followed by an appropriate etching sequence to form the depletion-mode gate recess. For example, a first selective etching step can be performed using, for example, an $H_2SO_4:H_2O_2:H_2O$ solution, which etches through the contact layer 122 and the transition layer 120, terminating at the second InGaP etch-stop layer 118. The second InGaP etch-stop layer 118 is then etched by a second selective etching step that uses, for example, a solution of $HCl:H_2O$. This etching step extends the gate recess through the second InGaP etch-stop layer 118. Depletion-mode gate metalization 128 is then deposited over the second schottky layer 116 through the opening defined in the photoresist pattern, forming the schottky contact that is used as the gate electrode of the depletion-mode PHEMT. Preferred metal deposition techniques are evaporation techniques. Preferred gate metalization includes Ti/Pt/Au. The photoresist pattern is removed, resulting in the structure of FIG. 1D.

An additional photolithographic process is then employed to define a photoresist pattern that includes an opening for the gate of the enhancement-mode PHEMT. This photolithographic step is followed by an appropriate etching sequence. For example, a selective gate recess etch can be performed using a $H_2SO_4:H_2O_2:H_2O$ solution, which terminates at the second InGaP etch-stop layer 118. The second InGaP etch-stop layer 118 is then etched using, for example, a solution of $HCl:H_2O$. The second schottky layer 116 is then etched using, for example, an $H_2SO_4:H_2O_2:H_2O$ solution, which etching step terminates at the first InGaP etch-stop layer 114. The first InGaP etch-stop layer 114 is then removed using a solution of $HCl:H_2O$. Enhancement-mode gate metalization 130 is then deposited over the first schottky layer 112 through the opening defined in the photoresist pattern, forming the schottky contact used as the gate electrode of the enhancement-mode PHEMT. The photoresist is removed, resulting in the depletion-enhancement PHEMT structure illustrated in FIG. 1E.

Figure 2A:
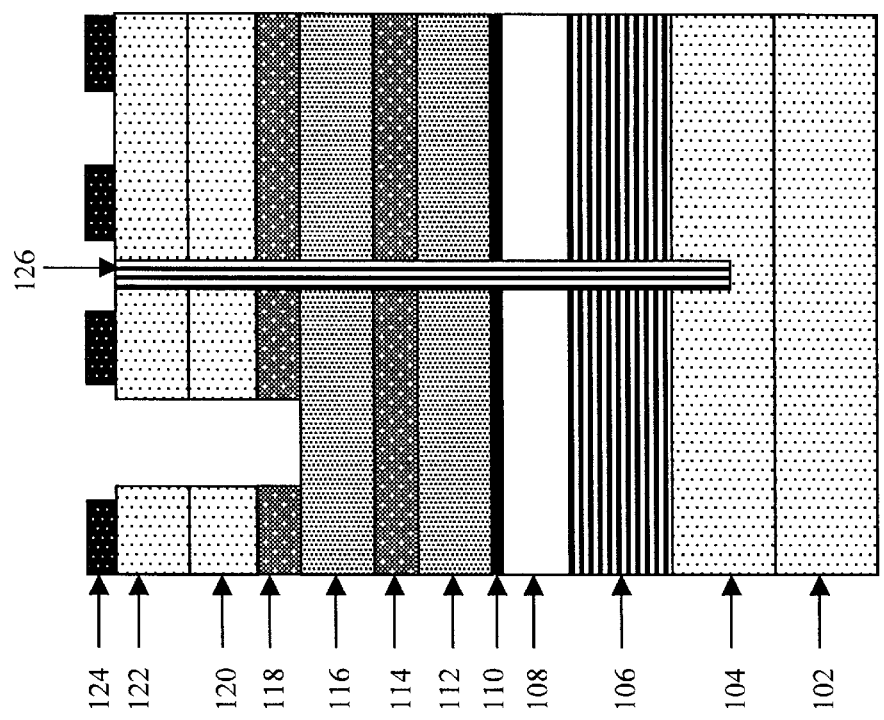
FIGS. 2A–2B are schematic cross-sectional views sequentially illustrating the formation of a PHEMT device containing both enhancement-mode and depletion-mode transistors, according to another embodiment of the invention.
Figure 1E:
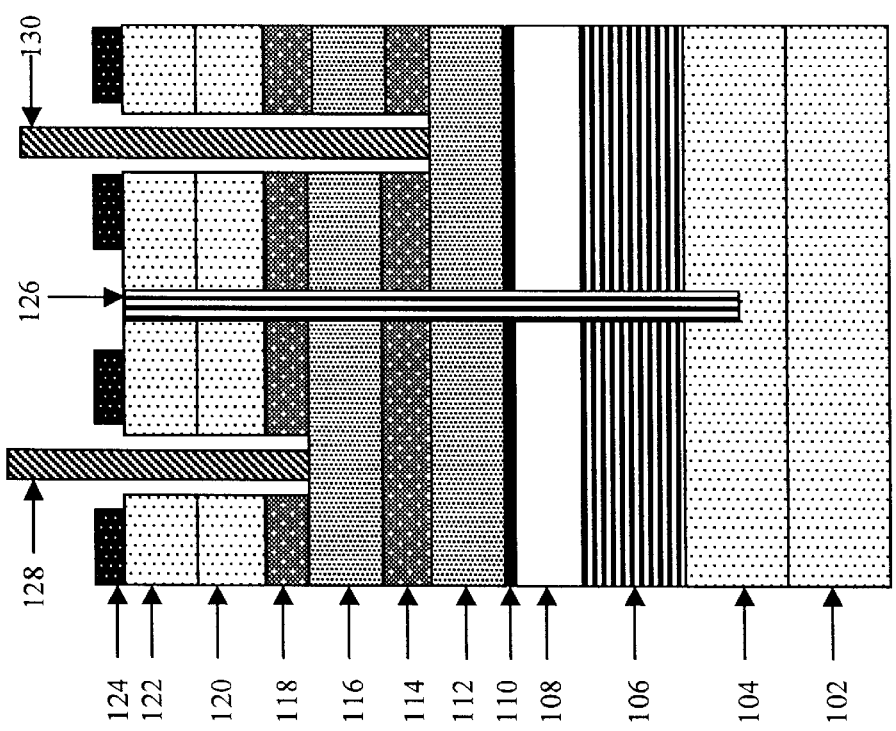

A second method of forming a PHEMT device containing both enhancement-mode and depletion-mode transistors will now be described in connection with FIGS. 2A–2B, in accordance with an embodiment of the invention. In this embodiment, the enhancement-mode PHEMT is provided with a double-recess structure (consisting of an upper recess portion and a lower recess portion). This double-recessed design typically has superior breakdown voltages relative to a single-recess design, such as that illustrated in FIG. 1E.

First, a multi-layer structure having ohmic contacts 124 and isolation structure 126 is formed as described above in connection with FIGS. 1A–1C.

Subsequently, an appropriate photolithographic process is employed to define a photoresist pattern that includes an opening corresponding to an upper portion of the gate recess for the enhancement-mode PHEMT. This photolithographic step is followed by an appropriate etching step. For example, a selective gate recess etch can be performed using a $H_2SO_4:H_2O_2:H_2O$ solution, which terminates at the second InGaP etch-stop layer 118. The second InGaP etch-stop layer 118 is then removed using, for example, a solution of $HCl:H_2O$. The resulting structure is illustrated in FIG. 2A A further appropriate photolithographic process is then employed to create a photoresist pattern that includes openings for both the lower portion of the gate recess of the enhancement-mode PHEMT and the entire gate recess for the depletion-mode PHEMT. The photoresist openings corresponding to the enhancement-mode PHEMT are narrower in this step than in the prior step, creating a double-recess enhancement-mode PHEMT after etching. A selective etching step is then performed using, for example, an $H_2SO_4:H_2O_2:H_2O$ solution. Etching is terminated at the first InGaP etch-stop layer 114 in the region of the enhancement mode gate and at the second InGaP etch-stop layer 118 in the region of the depletion mode gate (this is made possible by formation of the initial enhancement-mode recess illustrated in FIG. 2A). Then, using a solution of $HCl:H_2O$, for example, the first InGaP etch-stop layer 114 is removed in the area of the enhancement-mode gate, and the second InGaP etch-stop layer 118 is removed in the area of the depletion-mode gate. Enhancement-mode gate metalization 130 and depletion-mode gate metalization 128 are then deposited through the openings defined in the photoresist pattern, forming the schottky contacts used as the gate electrodes of the enhancement- and depletion-mode PHEMTs. The photoresist pattern is removed, producing the structure illustrated in FIG. 2B. The stepped (or double) recess for the enhancement-mode gate metalization 130 can be clearly seen in this figure.

Figure 3A:
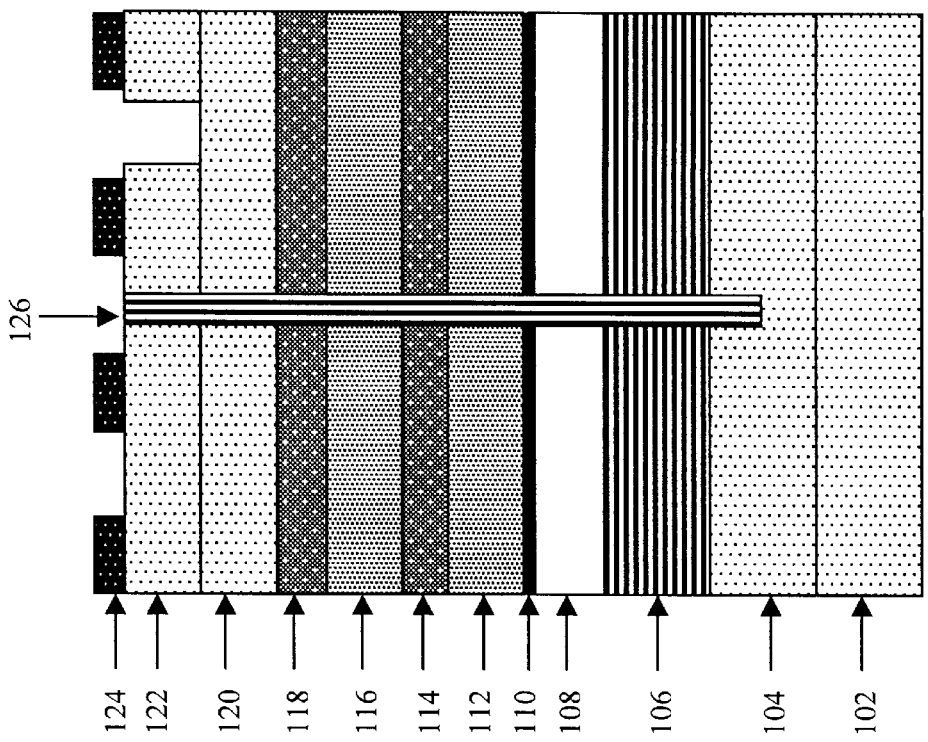
Figure 2B:
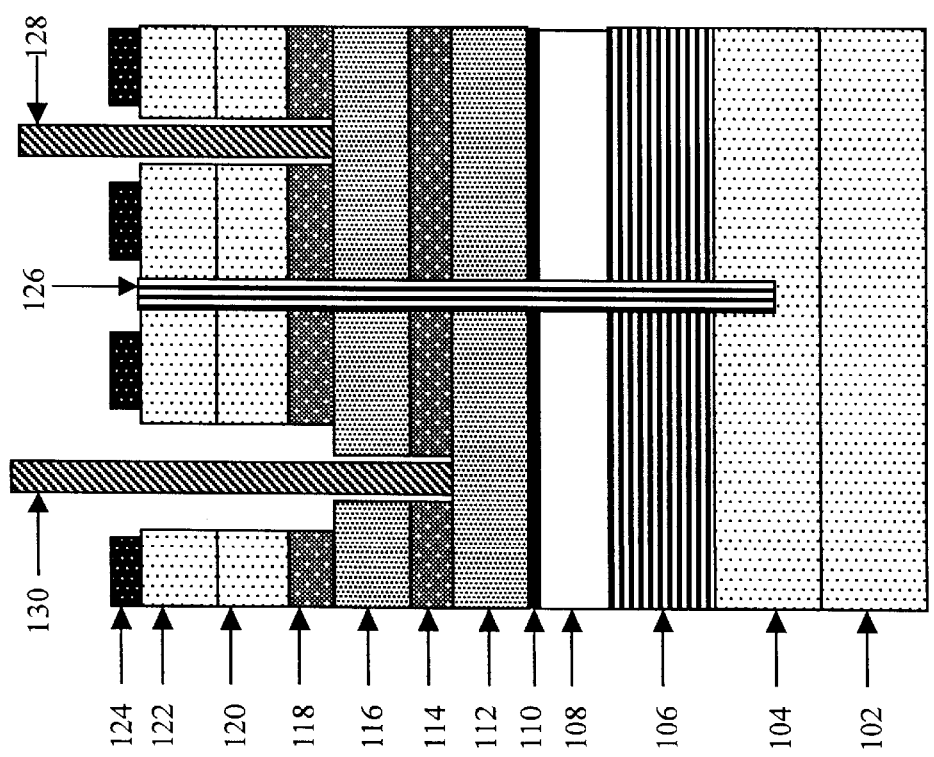

It is noted that the depletion-mode gate metalization 128 of FIG. 2B does not contain a stepped recess. However, in accordance with another embodiment of the invention, a method of forming an enhancement/depletion PHEMT device in which both the enhancement-mode gate metalization 130 and the depletion-mode gate metalization 128 have stepped recesses will now be described in connection with FIGS. 3A–3C.

First, a multi-layer structure, which includes ohmic contacts 124 and isolation structure 126, is formed as described above in connection with FIGS. 1A–1C. Subsequently, an appropriate photolithographic process is employed to define a photoresist pattern that includes an opening corresponding an upper gate recess for the depletion-mode PHEMT. This is followed by a non-selective gate recess etching step, using any one of a number of appropriate GaAs etch solutions known in the art, to etch the structure down to the transition layer 120. The photoresist is removed, resulting in the structure of FIG. 3A.

An additional photoresist pattern is defined, which includes an opening corresponding an upper gate recess for the enhancement-mode PHEMT. This photolithographic step is followed by an appropriate etching step. For example, a selective gate recess etch can be performed, for example, using an $H_2SO_4:H_2O_2:H_2O$ solution, which terminates at the second InGaP etch-stop layer 118. The second InGaP etch-stop layer 118 is then removed using, for example, a solution of $HCl:H_2O$. The photoresist is then removed. The resulting structure is illustrated in FIG. 3B.

A further photoresist pattern is defined, which includes openings for both the lower gate recess of the enhancement-mode PHEMT and the lower gate recess of the depletion-mode PHEMT. The openings for the lower gate recesses of the enhancement- and depletion-mode PHEMTs are narrower than the corresponding openings for the upper gate recesses, creating double recesses after etch. First, a selective gate recess etch is performed, for example, using a $H_2SO_4:H_2O_2:H_2O$ solution that stops (a) at the first InGaP etch-stop layer 114 in the region of the enhancement mode gate and (b) at the second InGaP etch-stop layer 118 in the region of the depletion mode gate. Then, using a solution of $HCl:H_2O$, for example, a further selective etch is performed that removes (a) the first InGaP etch-stop layer 114 in the region of the enhancement mode gate and (b) the second InGaP etch-stop layer 118 in the region of the depletion mode gate. Enhancement-mode gate metalization 130 and depletion-mode gate metalization 128 are then deposited through the openings defined in the photoresist pattern to form the schottky contacts that are used as the gate electrodes of the enhancement- and depletion-mode PHEMTs. The photoresist pattern is then removed, resulting in the structure illustrated in FIG. 3C. Due to the double recessed structure, the design shown has superior breakdown voltage in connection with both the enhancement-mode PHEMT and depletion-mode PHEMT.

Although the present invention has been described with respect to several exemplary embodiments, there are many other variations of the above-described embodiments that will be apparent to those skilled in the art. It is understood that these variations are within the teaching of the present invention, which is to be limited only by the claims appended hereto.

What is claimed is:

1. A depletion/enhancement PHEMT device structure comprising:
    a semiconductor substrate;
    a buffer region comprising one or more semiconductor buffer layers over said substrate;
    a III-V semiconductor channel layer over said buffer region;
    an electron donor layer over said channel layer;
    a GaAs or AlGaAs first schottky layer over said electron donor layer;
    a first InGaP etch stop layer over said first schottky layer;
    a GaAs or AlGaAs second schottky layer over said first InGaP etch stop layer, said first InGaP etch stop layer acting as an etch stop for said second schottky layer;
    a second InGaP etch stop layer over said second schottky layer;
    a doped GaAs contact layer over said second InGaP etch stop layer, said second InGaP etch stop layer acting as an etch stop for said contact layer;
    an isolation structure extending from an upper surface of said contact layer at least to said buffer region, said isolation structure defining a first active region and a second active region;
    an enhancement ohmic source contact and an enhancement ohmic drain contact disposed on said doped GaAs contact layer within said first active region;
    an enhancement gate recess extending from an upper surface of said contact layer and through said first InGaP etch stop layer within said first active region;
    an enhancement gate contact disposed over said first schottky layer within said enhancement gate recess;
    a depletion ohmic source contact and a depletion ohmic drain contact disposed on said doped GaAs contact layer within said second active region;
    a depletion gate recess extending from an upper surface of said contact layer and through said second InGaP etch stop layer within said second active region;
    a depletion gate contact disposed over said second schottky layer within said depletion gate recess.

2. The depletion/enhancement PHEMT device structure of claim 1, wherein said semiconductor substrate is a GaAs substrate.

3. The depletion/enhancement PHEMT device structure of claim 1, wherein said one or more buffer layers consist of one or more III-V semiconductor layers.

4. The depletion/enhancement PHEMT device structure of claim 3, wherein said one or more buffer layers comprise a GaAs buffer layer and a superlattice buffer comprising alternating layers of GaAs and AlGaAs.

5. The depletion/enhancement PHEMT device structure of claim 1, wherein said III-V semiconductor channel layer is an InGaAs channel layer.

6. The depletion/enhancement PHEMT device structure of claim 1, wherein said electron donor layer is a plane of silicon atoms.

7. The depletion/enhancement PHEMT device structure of claim 1, wherein said first schottky layer is an $Al_xGa_{1-x}As$ layer in which x ranges from 0.35 to 0.75, wherein said first schottky layer is from 50 to 150 Angstroms in thickness, wherein said second schottky layer is an $Al_xGa_{1-x}As$ layer in which x ranges from 0.15 to 0.25, and wherein said second schottky layer is from 50 to 150 Angstroms in thickness.

8. The depletion/enhancement PHEMT device structure of claim 7, wherein said first schottky layer is undoped and said second schottky layer is doped.

9. The depletion/enhancement PHEMT device structure of claim 1, wherein said first and second InGaP etch stop layers are $In_zGa_{1-z}P$ layers in which z ranges from 0.4 to 0.6, and wherein said first and second InGaP etch stop layers are from 10 to 50 Angstroms in thickness.

10. The depletion/enhancement PHEMT device structure of claim 1, wherein said isolation structure is an ion implanted structure.

11. The depletion/enhancement PHEMT device structure of claim 1, further comprising a doped GaAs or AlGaAs current passing transition layer between said second InGaP etch stop layer and said doped GaAs contact layer, said current passing transition layer having a lower net doping concentration than said contact layer.

12. The depletion/enhancement PHEMT device structure of claim 7, further comprising an undoped GaAs cap layer between said first schottky layer and said first InGaP etch stop layer, said cap layer ranging from 15 to 50 Angstroms.

13. The depletion/enhancement PHEMT device structure of claim 1, further comprising an AlGaAs spacer layer between said channel layer and said electron donor layer.

14. The depletion/enhancement PHEMT device structure of claim 1, wherein said depletion gate recess is greater in aperture within upper portions than within lower portions, and wherein said enhancement gate recess is greater in aperture within upper portions than within lower portions.

15. The depletion/enhancement PHEMT device structure of claim 1,
wherein said depletion gate recess is greater in aperture within said doped GaAs contact layer than within said second InGaP etch stop layer, and
wherein said enhancement recess is greater in aperture within said doped GaAs contact layer and said second InGaP etch stop layer than within said second schottky layer and said first InGaP etch stop layer.

16. The depletion/enhancement PHEMT device structure of claim 1, wherein said first InGaP etch stop layer provides an etch stop for the etching of said second schottky layer and said second InGaP etch stop layer provides an etch stop for the etching of said contact layer.

* * * * *